(12) United States Patent
Beng et al.

(10) Patent No.: US 6,714,112 B2
(45) Date of Patent: Mar. 30, 2004

(54) SILICON-BASED INDUCTOR WITH VARYING METAL-TO-METAL CONDUCTOR SPACING

(75) Inventors: Sia Choon Beng, Singapore (SG); Yeo Kiat Seng, Singapore (SG); Sanford Chu, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 0 days.

(21) Appl. No.: 10/144,542

(22) Filed: May 10, 2002

(65) Prior Publication Data

US 2003/0210121 A1 Nov. 13, 2003

(51) Int. Cl.[7] ................................................. H01F 5/00
(52) U.S. Cl. ........................ 336/200; 336/223; 336/232
(58) Field of Search ................................. 336/200, 223, 336/232; 29/602.1

(56) References Cited

U.S. PATENT DOCUMENTS

| | | | | |
|---|---|---|---|---|
| 4,992,769 A | * | 2/1991 | Oppelt | 336/180 |
| 5,618,777 A | * | 4/1997 | Hey-Shipton et al. | 505/210 |
| 5,635,892 A | * | 6/1997 | Ashby et al. | 336/200 |
| 6,026,311 A | * | 2/2000 | Willemsen Cortes et al. | 505/210 |
| 6,356,183 B1 | * | 3/2002 | Jou | 336/200 |
| 6,417,755 B1 | * | 7/2002 | Liu et al. | 336/200 |
| 2002/0067235 A1 | * | 6/2002 | Ueda et al. | 336/200 |
| 2003/0001713 A1 | * | 1/2003 | Gardner | 336/200 |

FOREIGN PATENT DOCUMENTS

| JP | 406231964 A | * | 8/1994 | ................. 336/225 |

* cited by examiner

Primary Examiner—Anh Mai (57) ABSTRACT

A silicon-based inductor in a semiconductor is disclosed. One embodiment provides for an inductor having a metal region comprising turns. The metal region has spacing between adjacent turns. The width of the spacing varies. The spacing is pre-determined to optimize the performance of the inductor by reducing eddy currents in the turns and reducing eddy currents induced in a substrate. One embodiment provides for an inductor having a spiral structure. The spiral structure may have a number of turns with the spacing between the turns of the inductor being larger near the inside of the spiral structure. A large spacing between the inductor's inner turns may serve to reduce both conductor eddy currents and the induced substrate current. Thus, the structure improves the inductor's overall performance.

25 Claims, 11 Drawing Sheets

Inductance Comparison of 4-Turns Circular Inductors with Fixed and Varying Spacing.

SILICON-BASED INDUCTOR WITH VARYING METAL-TO-METAL CONDUCTOR SPACING

FIELD OF THE INVENTION

The present claimed invention relates to the field of semiconductor processing. More particularly, the present claimed invention relates to a novel on-chip inductor with varying spacing between the turns of the inductor to optimize inductor performance by reducing substrate as well as conductor eddy current.

BACKGROUND ART

Increasing demands for personal mobile communication equipment have motivated recent research activities to focus on the development of inexpensive, small size, low power consumption, and low noise level systems. Advances in technology are making it possible to develop radio frequency (RF) circuits on a single silicon chip. Silicon, with its mature technology, low fabrication cost as well as high packing density is recognized as the only material able to satisfy the needs of a rapidly growing communication market. To fulfill all the above-mentioned requirements, one of the most important and indispensable circuit components is the on-chip silicon-based spiral inductor.

Nevertheless, difficulties of realizing high quality factor (Q) inductors pose a great challenge for silicon radio frequency integrated circuit (IC) applications. One difficulty in achieving such high-Q inductors is dealing with substrate losses. Several fabricating techniques, methods and processes have been proposed to improve the performance of silicon-based on-chip inductors because of their high substrate losses compared to the lossless substrate used in monolithic microwave integrated circuit (MMIC) technology (see e.g., U.S. Pat. No. 5,884,990 to Joachim N. Burghartz et al., entitled "Integrated Circuit Inductor", issued Mar. 23, 1999; N. Camilleri, D. Lovelace, J. Costa and N. David, "New Development Trends for Silicon RF Device Technologies", IEEE Electron Device Letters, Vol. 17, No. 9, pp. 428–430, September 1996; John R. Long and Miles A. Copeland, "The Modeling, Characterization and Design of Monolithic Inductors for Silicon RF ICs", IEEE Journal of Solid-State Circuits, Vol. 32, No. 3, pp. 357–368, March 1997; and Joachim N. Burghartz, A. E. Ruehli, M Soyuer, D. Nguyen Ngoc, and Keith A. Jenkins, "Novel Substrate Contact Structure for High-Q Silicon Integrated Spiral Inductors," Tech. Dig. Int. Electron Devices Meeting (IEDM), pp. 55–58, 1997).

Tedious processes such as etching away the silicon substrate underneath the inductors have been introduced to remove the substrate effects. While this may achieve good results, this processing technique raises reliability issues like packaging yield and long-term mechanical stability.

Since the conductive substrate contributes significantly to capacitive and magnetic loss for inductors on silicon, another common approach is to increase the substrate resistivity (see e.g., U.S. Pat. No. 5,884,990). This method seems promising but the option is uncommon for current CMOS technology because latch-up immunity for a highly conductive substrate has to be maintained at tighter design rules.

Another barrier for obtaining a high inductance (L) value is the typical usage of aluminum-copper (AlCu) interconnects in the silicon process. Alternatively, in the GaAs technology, thicker and less resistive gold (Au) metalization together with lossless substrate may permit a high performance inductor to be fabricated. However, this may come at added expense.

Other possible alternatives include employing an active inductor, whereby its electrical properties are described through an active circuitry. In an active inductor, high Q-factor and inductance can be achieved in a relatively small silicon area. But this approach suffers from high power consumption and high noise levels, which are not acceptable for low power and high frequency applications. In addition, the performance of active inductors is very sensitive and dependent on their biasing circuitry, making them time consuming and difficult to design.

With current processes and material limitations in the existing mature silicon technology as well as stringent circuit specifications, the conventional spiral inductor remains the simplest and most effective on-chip inductor.

Figure 1A:
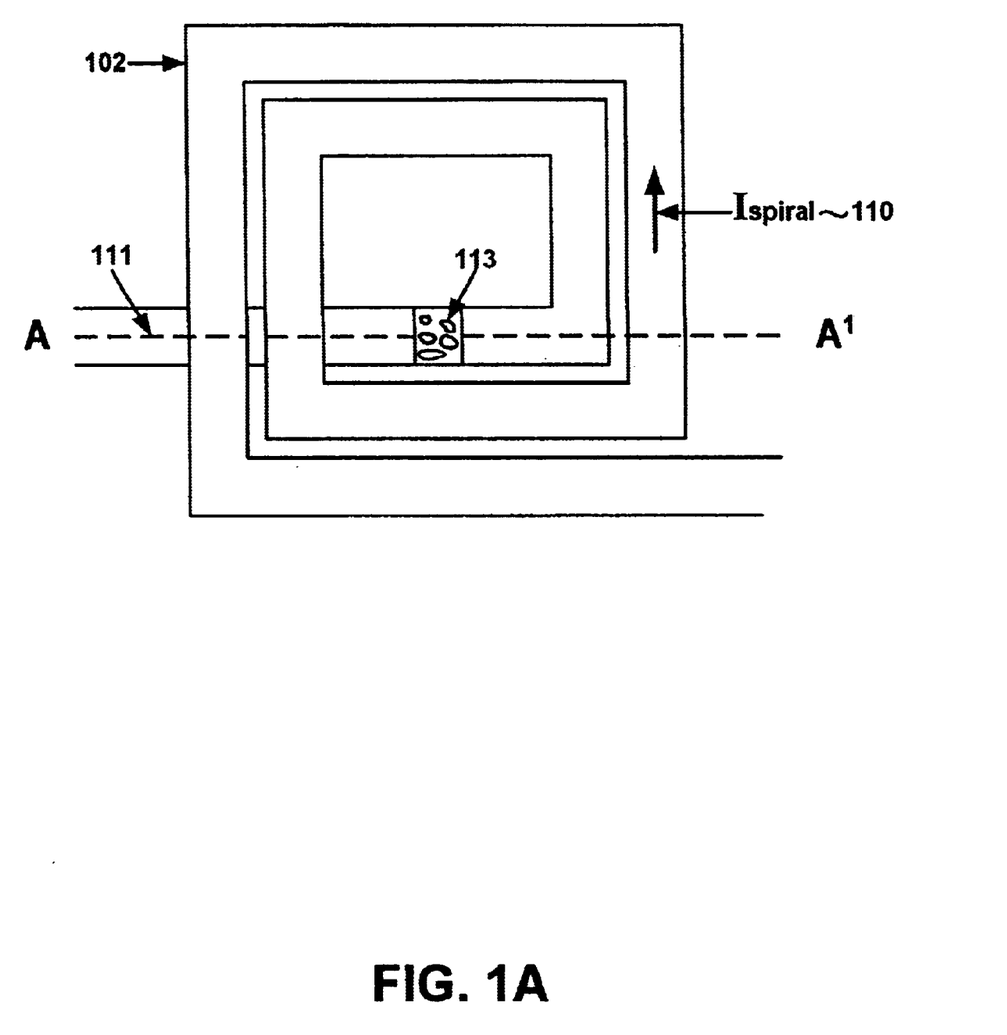
FIG. 1A is a top sectional view illustrating a conventional silicon based inductor.
Figure 1B:
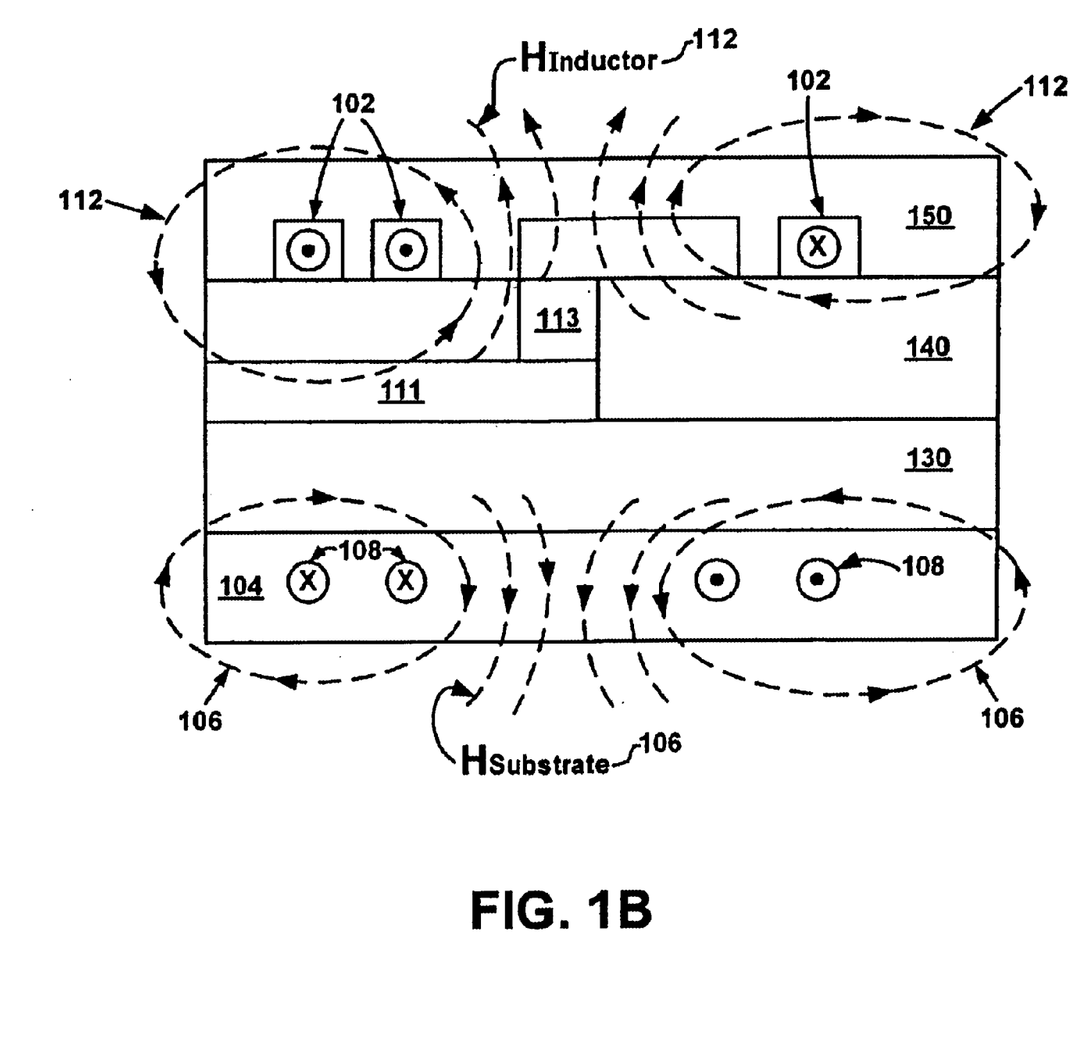
FIG. 1B is a side sectional view the conventional silicon-based inductor of FIG. 1A, illustrating substrate magnetic loss mechanisms.

FIG. 1A and FIG. 1B illustrate the formation of induced eddy current 108 in the substrate 104 and its magnetic flux interaction with that of the inductor. Referring to FIG. 1A and FIG. 1B, in the conventional spiral inductor 102 design, the inductor 102 is planar and fabricated on a highly conductive silicon substrate 104. Magnetic loss occurs when inductors 102 are built on such substrates 104. The inductor 102 is shown with its inductor current 110 traversing the spiral and with its associated magnetic field 112 ($H_{Inductor}$) Currents are shown with an "x" going into the Figures and a "point" coming out of the Figures, in the conventional manner.

According to Faraday's law, an image (or eddy) current 108 is induced in the substrate 104 underneath the spiral inductor 102. Since the silicon substrate 104 has low resistivity, this image current 108 can flow easily. In compliance with Lenz's law, the direction of flow for this induced current 108 is opposite to that of the inductor's current 110. This generates a parasitic magnetic field ($H_{Substrate}$) 106 in the substrate 104, which opposes the magnetic field 112 ($H_{Inductor}$) of the inductor 102. This results in a degradation of the inductor's overall useful inductance. FIG. 1 also shows the inductor's underpass 111 connected to the spiral by vias 113. Arrows are used to show the direction of magnetic fields. Also shown are a field oxide layer 130, a spiral arm inter-metal dielectric layer 150, and an inductor underpass inter-metal dielectric layer 140.

Figure 2:
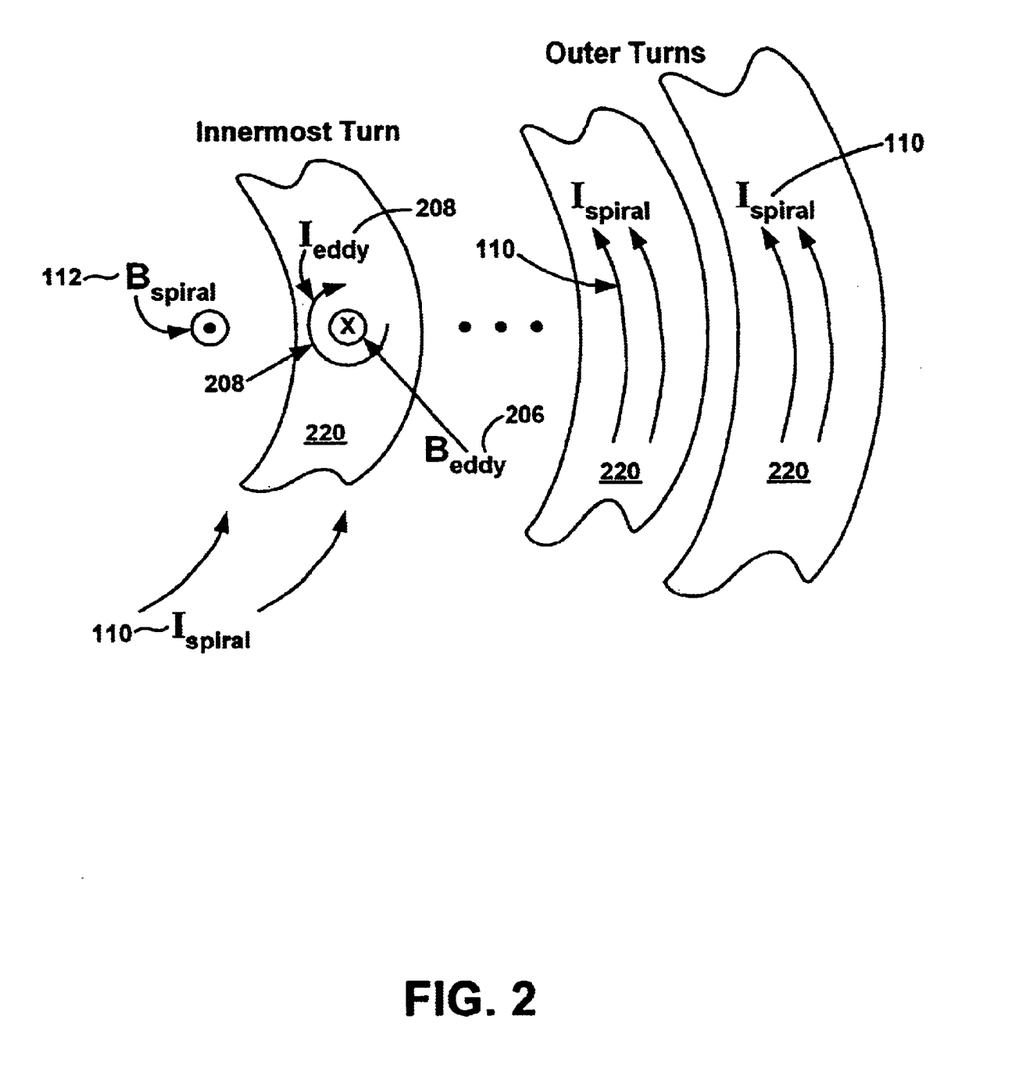
FIG. 2 is a top view of a conventional spiral inductor, illustrating conductor magnetic loss mechanisms.

Other than substrate eddy currents 108, effects of conductor eddy currents generated in the inner turns of spiral inductors must not be neglected. FIG. 2 illustrates the formation of these conductor eddy currents 208 ($I_{Eddy}$), as well as a conductor eddy magnetic flux $B_{Eddy}$ 206. The circular inductor 102 carries a current $I_{Spiral}$ 110 which flows in the direction as indicated. This current 110 generates an associated magnetic flux $B_{Spiral}$ 112, which has a maximum intensity at the center of the spiral 102. For the case of a huge inductor 102 with several turns 220, a large part of this magnetic flux 112 does not pass through the center of the spiral 102 but rather through its inner turns 220. Due to a time varying nature of the coil current, the generated magnetic flux $B_{Spiral}$ 112, also varies with time. In accordance to Faraday and Lenz's laws, an electric field is magnetically induced in these inner turns 220, generating circular eddy currents $I_{Eddy}$ 208 which flow in the direction opposing the original change in magnetic flux 112. The magnitude of this induced electrical field is proportional to the derivative of B(t) with respect to time suggesting this effect to be very significant at high frequencies.

The eddy currents 208 will cause a non-uniform inductor spiral current flow 110 in the inner turns 220 of the spiral

102. On the inner side of the inner turns 220, the inductor current 110 ($I_{Spiral}$) and eddy current 208 ($I_{Eddy}$) flow in the same direction. The outer side of the inner turn 220, however, has a very low current density because these two currents (110, 208) are in the opposite direction. In some cases, the magnitude of the eddy current 208 can be larger than the spiral current 110. Therefore, the resultant coil current (not shown) in the inductor's inner turns 220 will flow in the "wrong" direction. This drastically reduces the overall inductance as well as quality factor of the inductor 102.

As yet another concern, in order to achieve widespread acceptance, and to ensure affordability, any method of forming an on-chip silicon-based inductor, which overcomes the above-listed drawbacks, should be compatible with existing semiconductor fabrication processes.

Thus, a need exists for an on-chip silicon-based inductor. A further need exists for such an inductor formed to reduce magnetic losses due to the formation of eddy currents induced in the substrate by the inductor. A further need exists for an inductor formed to reduce the effects of eddy currents induced in the turns of the inductor itself. A further need exists for an inductor which may be formed with existing semiconductor fabrication processes such that significant revamping of semiconductor capital equipment is not required.

SUMMARY OF INVENTION

The present invention provides for an on-chip silicon-based inductor. Embodiments provide for such an inductor formed to reduce magnetic losses due to the formation of eddy currents induced in the substrate by the inductor. Embodiments provide for such an inductor formed to reduce the effects of conductor eddy currents induced in the inner turns of the inductor. Embodiments provide for an inductor which may be formed with existing semiconductor fabrication processes such that significant revamping of semiconductor capital equipment is not required.

A silicon-based inductor in a semiconductor is disclosed. One embodiment provides for an inductor having a metal region comprising turns. The metal region has spacing between adjacent turns. The width of the spacing between adjacent turns varies. The spacing has a pre-determined width that optimizes the performance of the inductor by reducing eddy currents in the turns and reducing eddy currents induced in a substrate.

One embodiment provides for an inductor having a spiral structure. The spiral structure may have a number of turns with the spacing between the turns of the inductor being larger near the inside of the spiral structure. A large spacing between the inductor's inner turns may serve to reduce both conductor eddy currents and the induced substrate current. Thus, the structure improves the inductor's overall performance.

In one embodiment, the width of the turns is greater near the outside of the spiral structure. In various embodiments, the turns of the spiral structure may be formed as metal region, such as copper or aluminum. In still other embodiments, the inductor may be planer and/or a stacked structure. The inductor may be circular in nature.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Embodiments of the present invention provide for an improved spiral inductor by optimizing its spiral's metal-to-metal conductor spacing. Thus, through such layout optimization techniques, the performance of a conventional silicon-based spiral inductor can be enhanced without any process modifications. In one embodiment, the spacing between adjacent turns is narrower near the outside of the inductor spiral. Both substrate eddy currents and spiral conductor eddy currents are reduced, in embodiments of the present invention.

To achieve high performance inductors 102 on CMOS technology, magnetic losses due to the formation of substrate eddy current 108 may be reduced. The basic working principle is to minimize undesirable magnetic flux 106 created by the induced substrate eddy current 108, especially at the inductor's core where the magnetic field is the strongest. This may be accomplished by reducing the current density at the inductor's inner turns 220. Meanwhile, when the current density of the inner-turns 220 is reduced, the induced substrate eddy current 108 at the inductor's core will be very much weaker. As a result, parasitic magnetic flux 106 generated in the substrate 104 directly under the inductor's core is smaller and this increases the resultant inductance as well as quality factor of the spiral inductor 102.

Figure 3A:
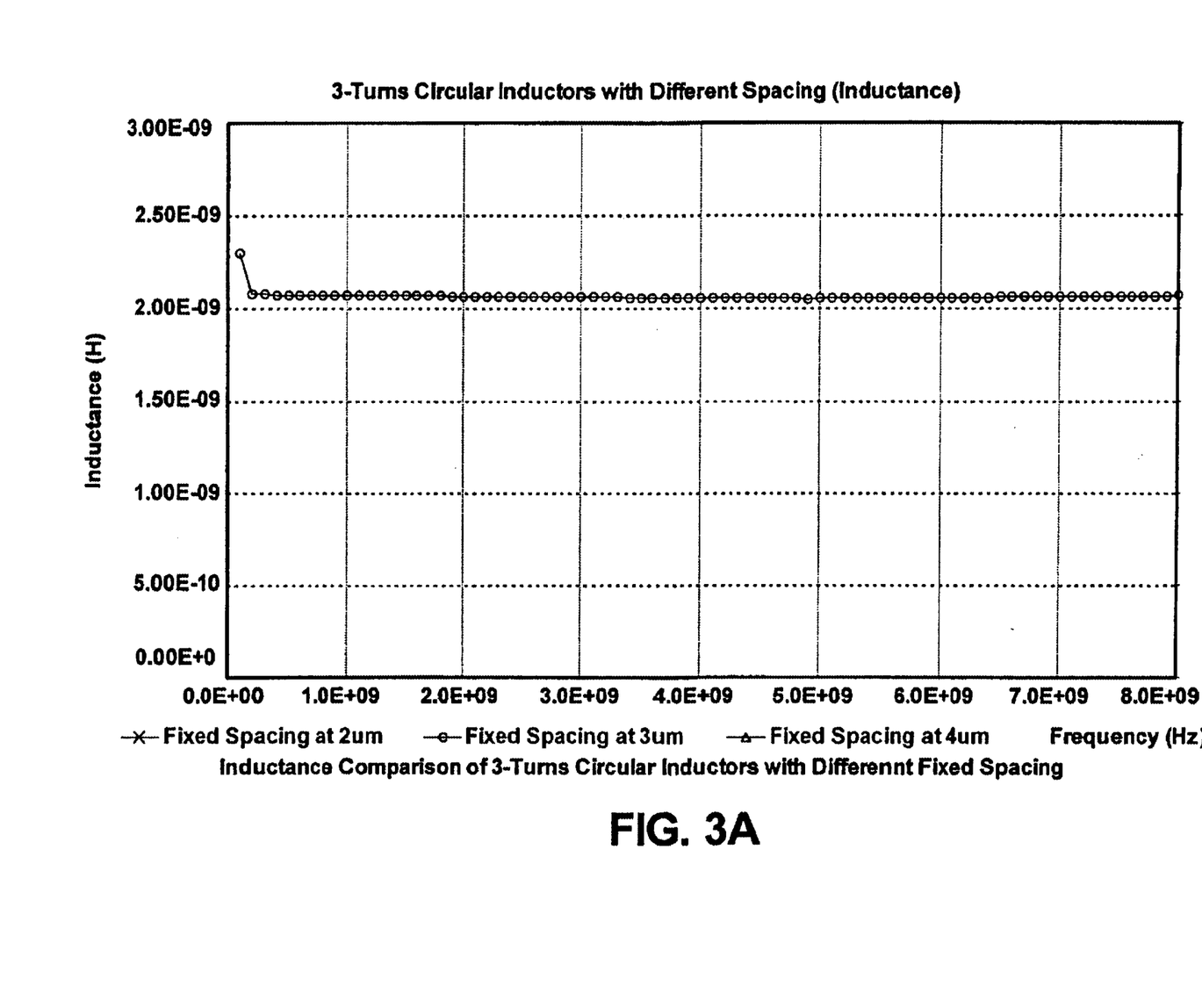
FIG. 3A is a graph illustrating a comparison of the inductance of circular inductors with different fixed spacing.
Figure 3B:
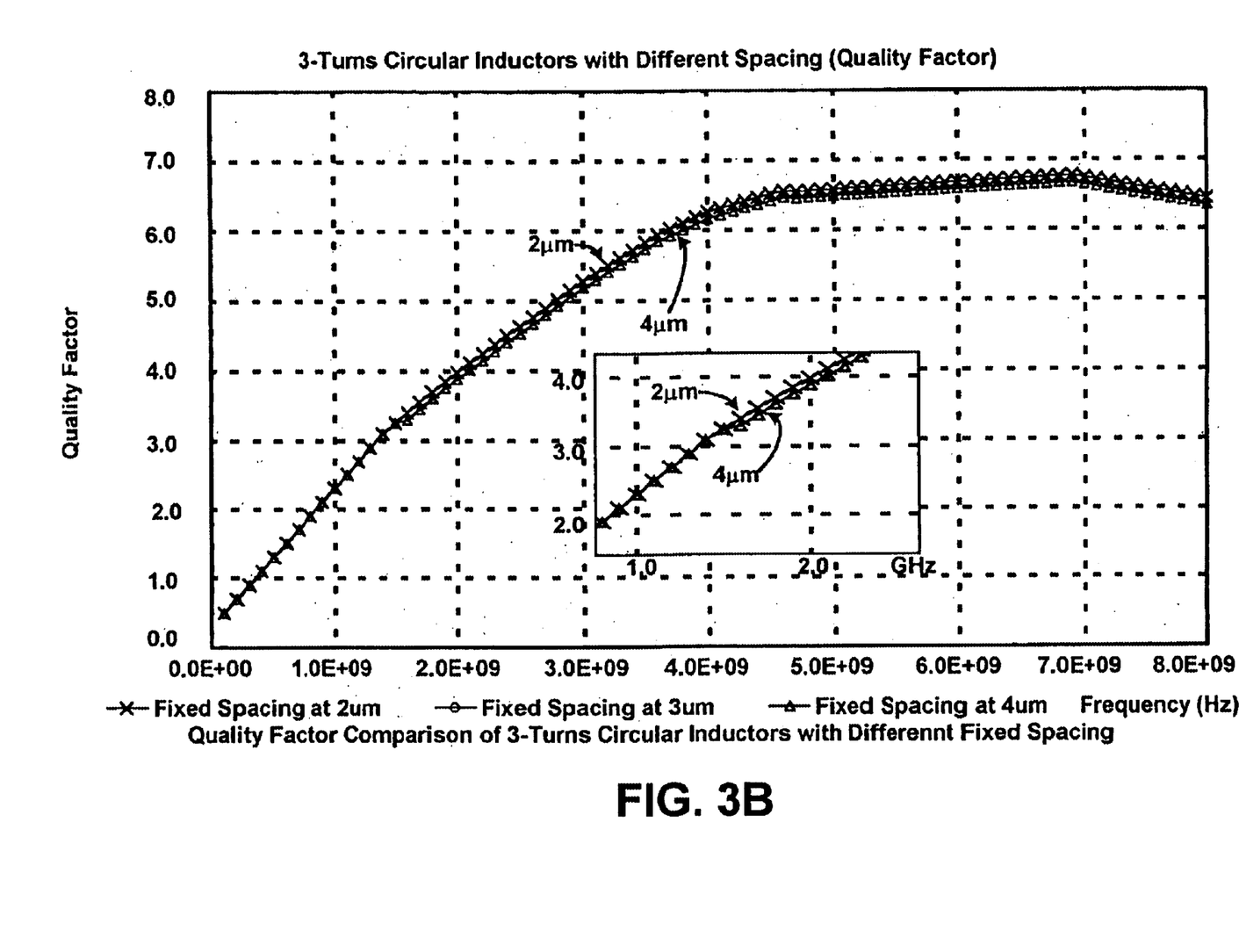
FIG. 3B is a graph illustrating a comparison of the quality factor of circular inductors with different fixed spacing.

Using a large uniform spacing between the turns 220 may serve to reduce both the effects of substrate eddy currents 108 and conductor eddy currents 208. However, if the spacing between each turn 220 is too large, the overall performance of the inductor 102 may be degraded. FIGS. 3A and 3B, respectively, compare the inductance and quality factor for inductors fabricated on a 0.25 μm technology, having different fixed spacing at 2 μm, 3 μm and 4 μm. From FIG. 3A, it is seen that the inductance plots of the three inductors 102 are almost the same. However, FIG. 3B shows that the 2 μm spacing inductor 102 displays a slightly better quality factor than the other inductors 102 because it occupies a smaller area compared to the other two inductors 102. Therefore, the inductor 102 with 2 μm spacing may have smaller parasitic oxide and substrate capacitances. The variation in performance may be more evident if the difference in spacing between the inductors 102 is greater.

Figure 4A:
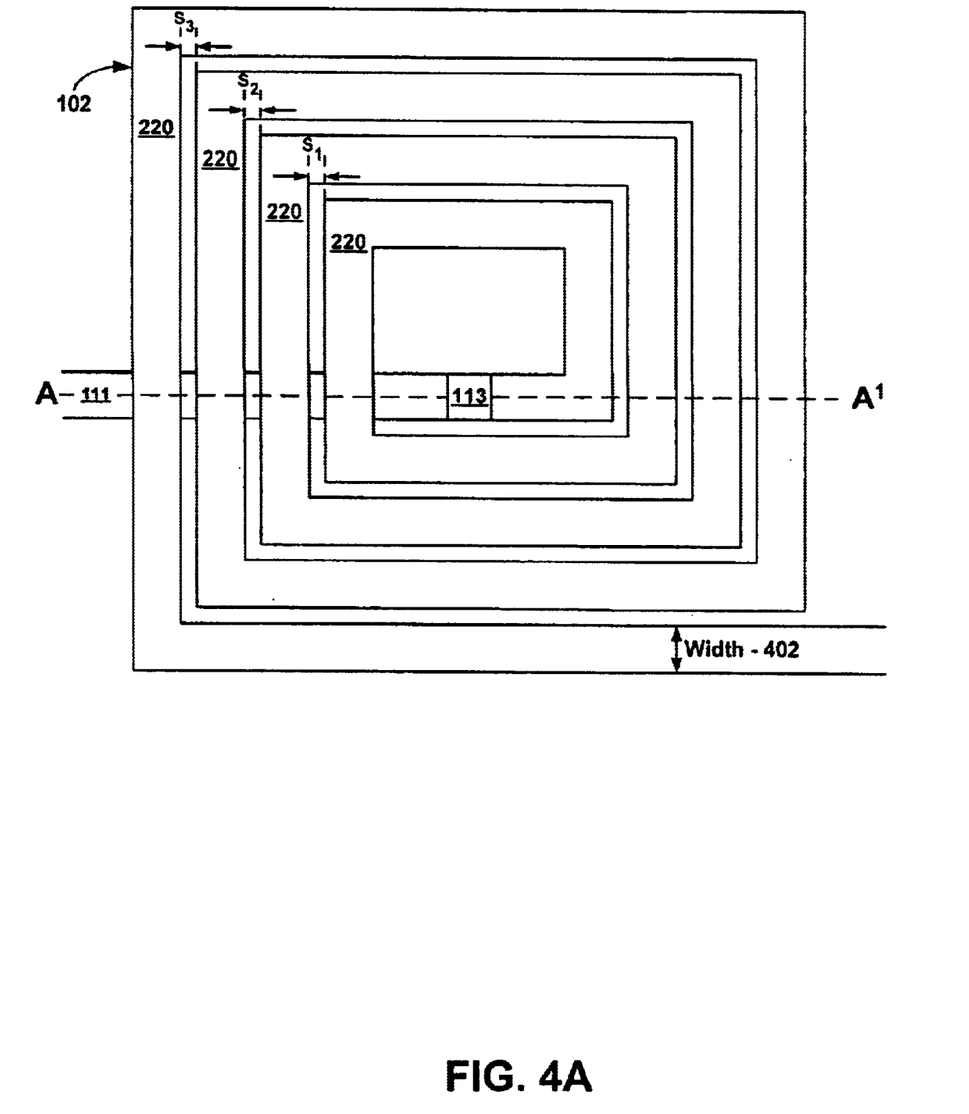
FIG. 4A is a top sectional view of a square spiral inductor with varying spacing, in accordance with embodiments of the present claimed invention.
Figure 4B:
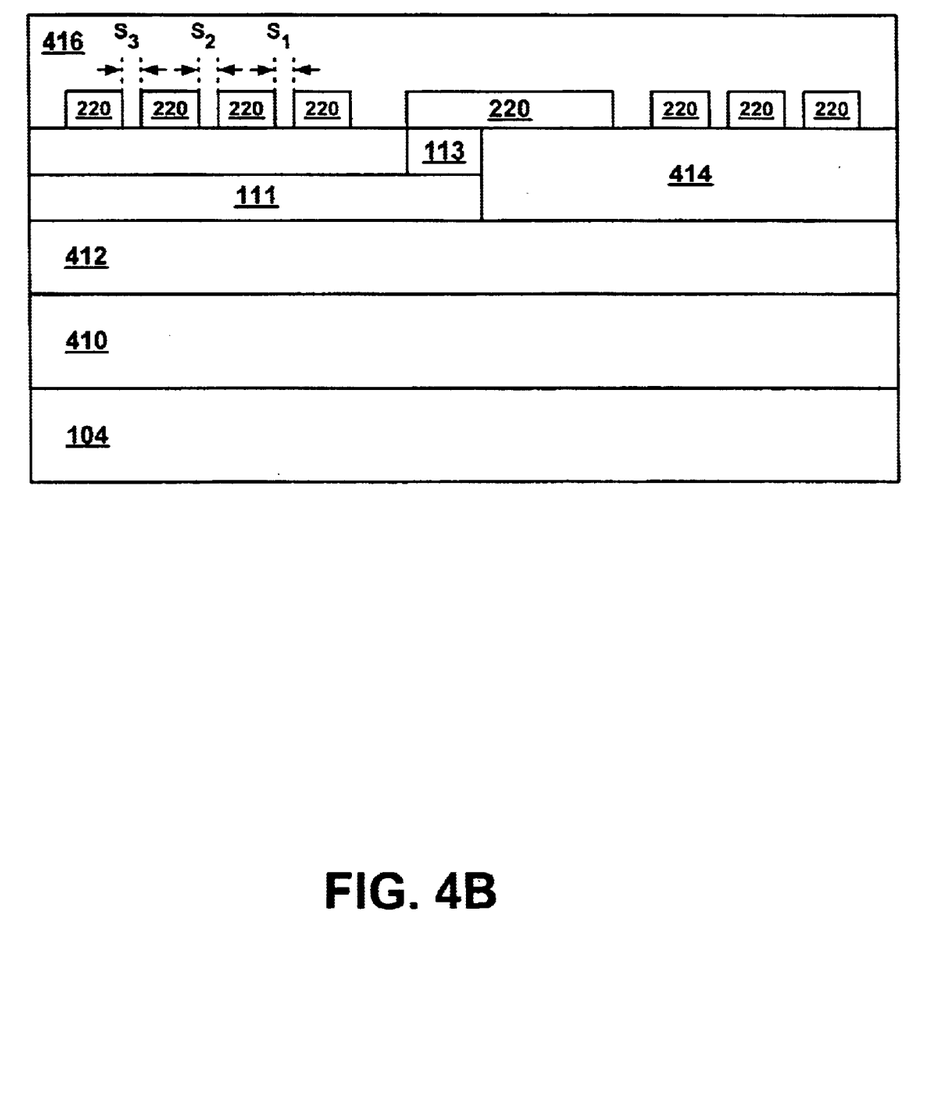
FIG. 4B is a side sectional view of the square spiral inductor with varying spacing of FIG. 4A, in accordance with embodiments of the present claimed invention.

Embodiments of the present invention provide for a novel inductor 102 with varying spacing to minimize the two magnetic loss mechanisms discussed herein. FIG. 4A shows a top view of an rectangular inductor 102, of one embodiment. FIG. 4B shows a cross sectional view of the inductor 102 of FIG. 4A taken across line A—A'. The inductor 102 may comprise a metal such as, for example, aluminum, copper, etc. However, the inductor 102 in general comprises any electrically conductive material. In one embodiment, the metal is any low resistive metal with good magnetic properties. Good magnetic properties may be defined as those magnetic properties that are suitable to form an inductor with desired characteristics. The spacing between the turns 220 for this inductor 102 decreases gradually from the center inner turns 220 to the outer turns 220. With a large spacing in the inductor's inner turns 220, mutual coupling at its core may be substantially reduced. This may somewhat degrade the inductor's 102 performance because mutual inductance between the turns 220 reduces when their spacing increases. On the other hand, a large spacing at the inductor's inner turns 220, may reduce the conductor eddy current 208 effect. Additionally, induced substrate current 108 may also diminish. Reduction of both the conductor eddy current 208 and the substrate eddy current 108 may more than compensate for any reduction in mutual inductance, thereby increasing the overall inductor's 102 characteristics.

Thus, an embodiment provides for a metal region comprising turns 220. The metal region has spacing between adjacent turns 220, with the spacing varying. The spacing has a pre-determined width to optimize the performance of the inductor 102 by reducing circular eddy currents $I_{Eddy}$ 208 in the turns 220 and reducing substrate eddy currents 108. Furthermore, the spacing has a pre-determined width that may optimize the effects of mutual coupling at the core of the inductor 102. The metal region may be said to have respective spacing between adjacent ones of said turns. The term adjacent ones of said turns may refer to the spacing between one turn and its adjacent turn at a given point.

FIG. 4B shows an embodiment in which the spacing between 4turns decreases such that $S_1>S_2>S_3$. However, it is appreciated that the spacing need not decrease gradually from the inner turns 220 to the outer turns 220. More generally, the inductor structure 102 is formed of a conductive region having a number of turns 220. When comparing a first spacing between adjacent turns (e.g., $S_1$) and a second spacing between adjacent turns 220 (e.g., $S_2$), where the second spacing is more towards the outside of the spiral 102, the second spacing may be smaller. Thus, this leaves open other alternatives for the spacing between the turns 220. For example, the spacing may have portions for which it remains substantially constant as the spiral 102 is traversed outward. The spacing may also increase for portion of the outward traversal of the spiral 102, although this may be undesirable, as the mutual coupling may be negatively impacted. FIG. 4B also shows a field oxide layer 410, an inter metal dielectric layer 412, a metal N-1 layer 414, and a metal N layer 416.

Figure 5A:
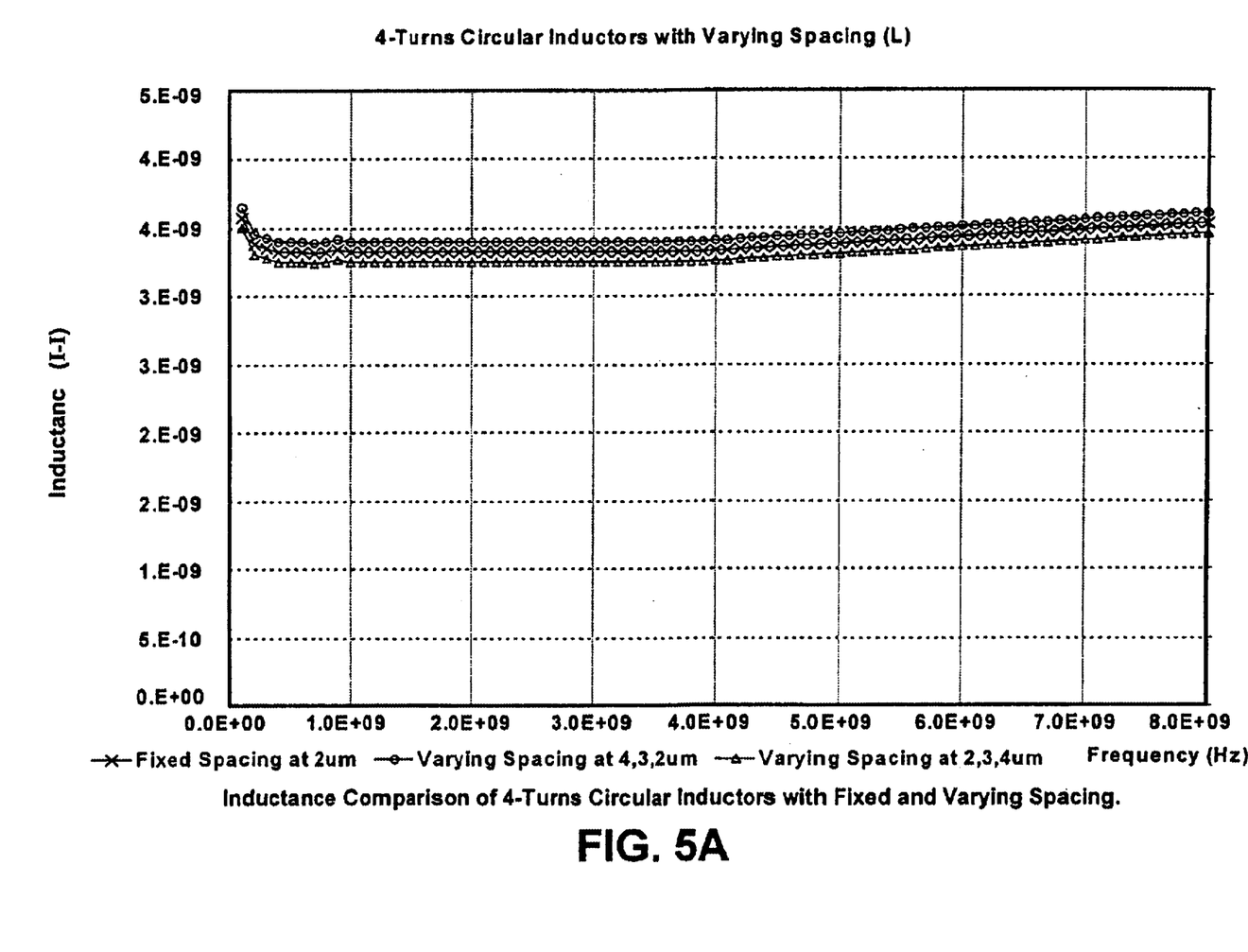
FIG. 5A is a graph illustrating a comparison of the inductance of circular inductors with varying spacing, in accordance with embodiments of the present claimed invention.
Figure 5B:
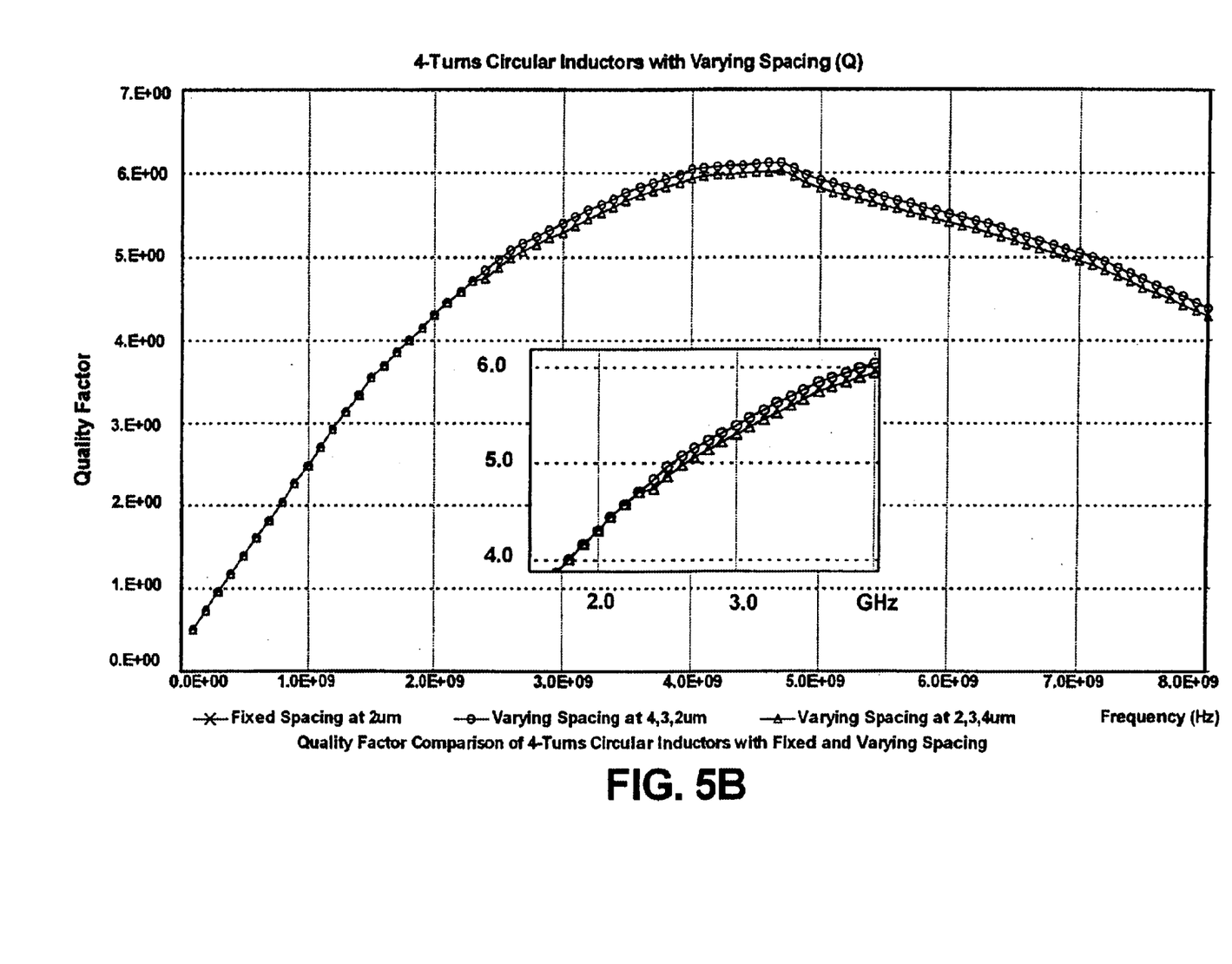
FIG. 5B is a graph illustrating a comparison of the quality factor of circular inductors with varying spacing, in accordance with embodiments of the present claimed invention.

For exemplary purposes, FIGS. 5A and 5B compare the inductance as well as quality factor for three different 4-turn circular inductors 102. One inductor 102 has a fixed spacing of 2 μm, the second inductor 102 has a varying spacing of 4 μm, 3 μm, and 2 μm, with the smallest spacing at the outer turn 220, the third inductor 102 has a varying spacing of 2 μm, 3 μm, and 4 μm with the largest spacing at the outer turn 220. The performance of inductor 102 with larger spacing at its inner turn 220 is better compared to the one with a fixed spacing. The inductor 102 with increasing spacing from inner to outer turns 220 shows worse performance compared to the fixed spacing inductor 102. Hence, the inductor design with decreasing spacing from inner to outer turn 220 yields the best performance among the three inductors 102 in this sample.

It is appreciated that the present invention is not limited to the sizes of spacing chosen for the graphs of FIGS. 5A and 5B. Using other size spacing may lead to even better results. A larger improvement may result if a design with a larger spacing for the inner turns 220 and very small spacing for the outer turns 220 is adopted. For example, a spacing of larger than 4 μm may be used inside and/or smaller than 2 μm may be used outside.

Figure 6:
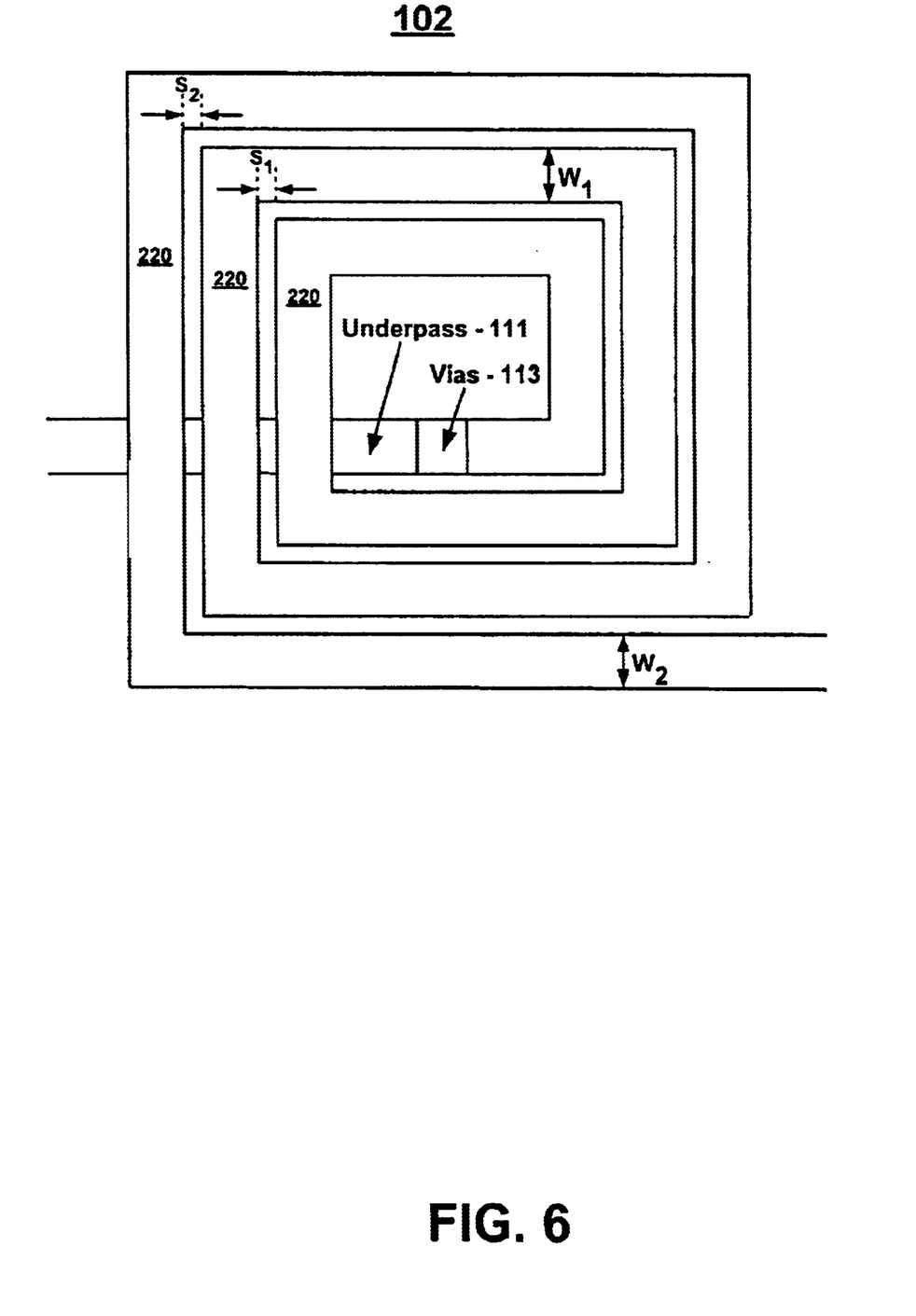
FIG. 6 is a top sectional view of a square spiral inductor with varying spacing and varying width of the turns, in accordance with embodiments of the present claimed invention.

The present invention is also well suited to be implemented with varying width inductors 102, e.g., the width of a turn 402 increasing gradually from inner to outer turns 220. The present invention is well-suited to using an inductor 102 in which the width of the turns 402 decreases gradually from inner to outer turns 220. FIG. 6 shows an embodiment in which not only does the width of the turns 402 increase as the spiral is traversed outward, but the spacing between turns 220 narrows as the spiral is traversed. More generally, the spacing of an inner portion (e.g., $S_1$) of the spiral 102 is wider than the spacing of a portion (e.g., $S_2$) closer to the exterior. This may further enhance the inductor's 102 per unit area inductance as well as quality factor. It is not required, however, that the width of the turns 402 continually increase as the spiral is traversed outward. More generally, the width of a turn 402 of an inner portion (e.g., $W_1$) of the spiral 102 is more narrow than the width of a turn 402 (e.g., $W_2$) closer to the exterior.

Figure 7:
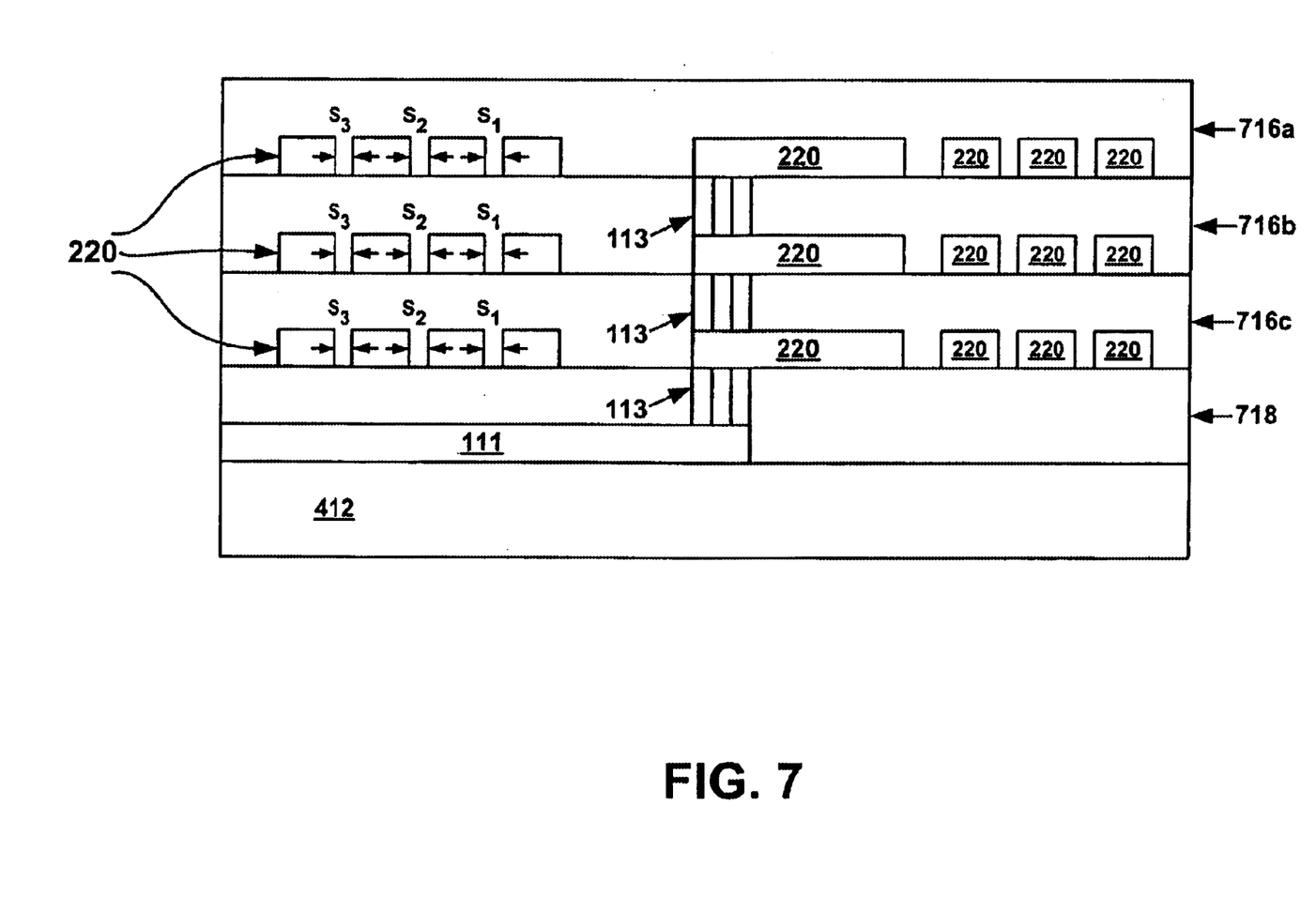
FIG. 7 is a side sectional view of a stacked inductor with varying spacing between the turns, in accordance with embodiments of the present claimed invention.

Furthermore, while FIG. 4A shows a square spiral inductor 102, it is appreciated that other structures may be used within the spirit of the invention. For example, circular, polygonal, or elliptical spiral inductors 102 or the like may be used. Other embodiment provides for stacked, as well as copper inductors. FIG. 7 illustrates an embodiment of a stacked inductor 102 with each of the three spirals in successive layers of intermetal dielectric (716a, 716b, 716c) having a spacing between turns 220 which diminishes towards the exterior of the spiral. An underpass 111 is connected by vias 113 in a dielectric layer 718. It is appreciated that it is not required that each spiral be fabricated with identical dimensions. For example, one spiral may be fabricated with a substantially fixed spacing and another with a substantially decreasing spacing as the spiral is traversed outward. Other combinations may be used as well to vary the spacing between turns 220 of the inductor 102 such that substrate eddy currents 108 and/or conductor eddy currents 208 may be reduced.

Thus, the present invention provides for an on-chip silicon-based inductor, based on layout optimization technique. Embodiments provide for such an inductor formed to reduce eddy currents induced in the substrate by the inductor. Embodiments provide for such an inductor formed to reduce eddy currents induced in the turns of the inductor. The invention provides for an inductor which meets the above needs and whose formation is compatible with existing semiconductor fabrication processes such that significant revamping of semiconductor capital equipment is not required.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

We claim:

1. A silicon-based inductor, comprising:
    an electrically conductive region having a shape formed of turns;
    said electrically conductive region having an outer turn;
    said electrically conductive region having respective spacings between adjacent ones of said turns of said electrically conductive region;
    a spacing at a first location being greater than a spacing at a second location; and
    said second location closer to said outer turn than said first location is to said outer turn.

2. The silicon-based inductor of claim 1, wherein said turns form a spiral structure.

3. The silicon-based inductor of claim 2, wherein said spiral structure is a substantially circular spiral.

4. The silicon-based inductor of claim 2, wherein said spiral structure is a substantially rectangular spiral.

5. The silicon-based inductor of claim 2, wherein said spiral structure is a substantially polygonal spiral.

6. The silicon-based inductor of claim 1, wherein the width of said electrically conductive region is greater at said outer turn than at an inner turn of said electrically conductive region.

7. The silicon-based inductor of claim 1, wherein said electrically conductive region comprises aluminum.

8. The silicon-based inductor of claim 1, wherein said electrically conductive region comprises copper.

9. A silicon-based inductor, comprising:
    a metal region comprising a spiral structure, said structure having an outside;
    said spiral structure having a first spacing between ones of turns of said spiral structure;
    said spiral structure having a second spacing between ones of said turns of said spiral structure, said second spacing being closer to said outside than said first spacing is to said outside; and
    said second spacing being smaller than said first spacing.

10. The silicon-based inductor of claim 9, wherein the width of a turn at a first location is greater than the width of a turn at a second location, said first location closer to said outside than said second location is to said outside.

11. The silicon-based inductor of claim 9, wherein said spiral structure is substantially planar.

12. The silicon-based inductor of claim 9, wherein said inductor comprises a plurality of stacked spiral structures.

13. The silicon-based inductor of claim 9, wherein said metal comprises aluminium.

14. The silicon-based inductor of claim 9, wherein said metal comprises copper.

15. The silicon-based inductor of claim 9, wherein said spiral structure comprises inner turns and outer turns and wherein the respective spacing between ones of said turns decreases from said inner turns to said outer turns.

16. A silicon-based inductor, comprising:
    a metal region comprising turns;
    said metal region having respective spacing between adjacent ones of said turns, said spacing varying; and
    said spacing being pre-determined to reduce eddy currents in said turns and reduce eddy currents induced in a substrate.

17. The silicon-based inductor of claim 16, wherein said pre-determined spacing optimizes inductor performance by increasing the effects of mutual coupling at a core of said inductor while reducing said eddy currents in said turns and reducing said eddy currents induced in said substrate.

18. The silicon-based inductor of claim 16, wherein said spacing is wider between adjacent ones of inner turns than between adjacent ones of outer turns.

19. The silicon-based inductor of claim 16, wherein said turns form a spiral structure.

20. The silicon-based inductor of claim 16, wherein the width of an outer turn is greater than the width of an inner turn.

21. The silicon-based inductor of claim 16, wherein said inductor comprises a plurality of stacked spiral structures.

22. The silicon-based inductor of claim 16, wherein said metal comprises aluminum.

23. The silicon-based inductor of claim 16, wherein said metal comprises copper.

24. The silicon-based inductor of claim 16, wherein said metal has good magnetic properties such that said inductor is formed with desired characteristics.

25. The silicon-based inductor of claim 24, wherein said metal has a low resistance.

* * * * *